United States Patent [19]
Gau

[11] Patent Number: 5,274,345
[45] Date of Patent: Dec. 28, 1993

[54] DUAL FUNCTION REFLECTOR STRUCTURES FOR INTERDIGITAL SAW TRANSDUCER

[75] Inventor: John Gau, West Hartford, Conn.

[73] Assignee: Andersen Laboratories, Bloomfield, Conn.

[21] Appl. No.: 882,612

[22] Filed: May 13, 1992

[51] Int. Cl.$^5$ .............................................. H03H 9/25
[52] U.S. Cl. ..................... 333/153; 333/195; 310/313 B; 310/313 D; 29/25.35
[58] Field of Search ................ 333/150, 151, 153, 154, 333/193, 194, 195; 310/313 R, 313 B, 313 C, 313 D; 29/25.35; 364/821

[56] References Cited

U.S. PATENT DOCUMENTS

| | | | |
|---|---|---|---|
| Re. 32,859 | 2/1989 | Marshall et al. | 333/151 |
| 3,970,970 | 7/1976 | Worley | 310/313 R X |
| 4,162,465 | 7/1979 | Hunsinger et al. | 333/151 |
| 4,162,466 | 7/1979 | Hunsinger et al. | 333/194 |
| 4,353,046 | 10/1982 | Hortmann | 333/194 |
| 4,485,364 | 11/1984 | DeVries | 333/194 |
| 4,616,197 | 10/1986 | Wright | 333/194 |
| 4,642,506 | 2/1987 | Lewis | 310/313 D |
| 4,642,507 | 2/1987 | Suthers et al. | 310/313 B |
| 4,684,841 | 8/1987 | Este et al. | 310/313 B |
| 4,742,319 | 5/1988 | Sone | 333/195 |
| 4,760,359 | 7/1988 | Shiba et al. | 333/194 |
| 4,813,271 | 5/1989 | Greenwood | 73/702 |
| 4,814,658 | 3/1989 | Suthers et al. | 310/313 D |
| 4,870,312 | 9/1989 | La Rosa et al. | 310/313 B |
| 4,871,984 | 10/1989 | Laton et al. | 331/107 A |
| 4,902,925 | 2/1990 | Wright | 310/313 B |
| 4,910,839 | 3/1990 | Wright | 29/25.35 |
| 4,933,588 | 6/1990 | Greer | 310/313 D |
| 4,950,935 | 8/1990 | Furukawa | 310/313 R |
| 4,965,479 | 10/1990 | Elliott et al. | 310/313 D |
| 5,010,269 | 4/1991 | Hikita et al. | 310/313 B |
| 5,028,831 | 7/1991 | Malocha et al. | 310/313 A |

FOREIGN PATENT DOCUMENTS 140618  5/1985  European Pat. Off. ............ 333/154

OTHER PUBLICATIONS

RSRE Memorandum 3833 'M. F. Lewis, "A Study of group type single phase unidirectional SAW transducers" on LiNbO$_3$ and Quartz (1985).

"Low-Loss Undirectional Acoustic Surface Wave Filters" by R. C.. Rosenfeld, C. S. Hartman, and R. B. Brown, Annual Symposium Frequency Control 1974 pp. 299-303.

*Primary Examiner*—Benny Lee
*Attorney, Agent, or Firm*—Istrate Ionescu

[57] ABSTRACT

A SAW reflector structure located between multiple interdigitated generator/receivers located on a piezoelectric substrate forming a ladder type SAW device is described. The reflector structure reduces both reflections due to mechanical-electrical loading from the physical presence of generator/receiver fingers without using a split finger arrangement as well as reflections due to the regenerated reflection from the generator/receiver. The reflector has a first acoustic phase center. The generator/receiver has a second acoustic phase center, a regenerated voltage coefficient of reflection, $r_e$ and a mechanical-electrical loading coefficient of reflection, $r_m$. The reflector is used for simultaneously reflecting both regenerated and mechanical-electrical loading induced reflections from the generator/receiver. The reflector is sized for a strength of reflection equal to the square root of the sum of the regenerated and mechanical-electrical loading reflections squared. The reflector's phase center is positioned an integral number of acoustic half wavelengths from the phase center of the generator/receiver plus a distance equivalent to either plus or minus half the phase angle given by 90 degrees plus the inverse tangent of the ratio of the the mechanical-electrical loading reflection to the regenerated reflection.

20 Claims, 6 Drawing Sheets ial such as quartz $SiO_2$, lithium niobate $LiNbO_3$,
DUAL FUNCTION REFLECTOR STRUCTURES FOR INTERDIGITAL SAW TRANSDUCER

FIELD OF INVENTION

This invention relates to a surface acoustic wave (hereinbelow abbreviated SAW) device that can be used as a SAW filter or a delay line, etc.

BACKGROUND OF THE INVENTION

SAW devices having interdigital transducers have been described in David P. Morgan's treatise titled *Surface Wave Devices for Signal Processing*, Elsevier Science Publishing Co., N.Y., (1985), ISBN 0-444-42511-X, incorporated herein by reference in its entirety. Generally, a surface acoustic wave (SAW) device, such as a delay line, comprises a transmitting (launching) and a receiving transducer placed on the surface of a piezoelectric substrate. The transmitting transducer uses voltage variations derived from input radio frequency electro-magnetic signals to induce mechanical flexures of the atoms along the surface of a piezoelectric substrate, thereby creating surface waves having acoustic properties. The substrate supporting the surface waves is generally made of a piezoelectric material such as quartz $SiO_2$, lithium niobate $LiNbO_3$, lithium tantalate $LiTaO_3$, bismuth germanium oxide $Bi_{12}GeO_{20}$ or other similar substances. The surface acoustic waves thus created travel along the surface of the substrate at speeds ranging from about 3159 meters per second for Quartz and 3992 meters per second for lithium niobate to as slow as 1830 meters/second for bismuth germanium oxide. The voltage induced surface acoustic waves travel away from the transmitting transducer along the surface of the substrate until they reach the receiving transducer. The receiving transducer performs the inverse function of the transmitting transducer, that is, it converts the arriving surface waves on the substrate surface to a voltage resembling the one originally impressed on the transmitting transducer.

Ideally, the function of above described SAW structure is to recreate a delayed, but undistorted copy at the receiving transducer of the original voltage waveform convolved with the designed impulse response of the SAW device. However, because of reflections arising from the interaction of various structures associated with the transmitting and receiving transducers, a faithful, undistorted convolution of the original waveform with the impulse response is not achieved at the receiving transducer.

There are two types of reflections referenced in the present invention that interfere with the reaction of the desired output signal. A first type of reflection is due to the physical presence and dimensional extent of multiple fingers of interdigitated transducer structures interacting with the surface of the piezoelectric substrate. The presence of the transducer structure and its edges causes undesired, interfering reflections related to the geometric arrangement, size, and conductivity of the transmitting and receiving transducers. This type of interfering reflection is caused by the discontinuity on the surface of the piezoelectric substrate represented by the physical presence of the transducer structures. These reflections emanate from the interaction of the acoustic wave as it encounters the dissimilar material of the many interdigitated fingers on the surface of the substrate. These reflections add coherently from each of the fingers to either reinforce or reduce at various times certain portions of the desired signal. Furthermore, these reflections exist even if the transducer producing them presents a zero electrical impedance to the electrical current generated by the incoming acoustic wave, i.e. is shorted. This type of reflection will be referred to as a "mechanical-electrical loading" reflection due to essentially its mechanical nature. This reflection is designated as $P_{11}$ by Morgan in *Electronics Letters* 26, Eq 5, pg 1200 (1990) and by Hartmann and Abbott in the *Ultrasonics Symposium Proceedings*, Eq 1, pg 80 (1989). A well known technique for minimizing this type of reflection depends on "split fingers", or "double electrode transducer" technique as discussed, for example, in U.S. Pat. Nos. 4,353,046 and 4,162,465, and is well known in the art.

The maximum operating frequency of a split finger device is is generally only half that of SAW devices having non-split finger construction assuming the same lithographic limitations on the physical etching of the interdigital transmitter and receiver structures. This is because the split finger design requires the presence of two fingers (as compared to one), with attendant decrease in finger width and increase in lithographic complexity. It is therefore desirable to have non-split finger construction.

A second type of reflection is generated from the interaction of the receiving transducer output voltage with the surface of the substrate as induced by the voltage of the output waveform. This type of reflection emanates from the receiving transducer. Subsequently, the reflection travels from the output transducer to the input transducer, and is reflected back from the structure of the input transducer. This reflection is distinguished from the first type because it is not generated by the mechanical presence of the transducer structure, but by electric fields associated with the output voltage that has to be created by the transducer to operate with a useful electrical source or load impedance of typically 75 or 50 $\Omega$. This reflection will generally be referred to as the "regenerated" load related reflection. This reflection is given by the second term of equation 5 of Morgan's *Electronics Letters* 26, pg 1200 (1990), referenced above. The quantites referred in this term can be computed using analysis methods familiar in the current art. One manifestation of this type of reflection is the triple transit distortion well known in the art, and is minimized in the prior art by the use of multiphase matching networks as described, for example, in U.S. Pat. No. 3,686,518. Such a multiphase matching structure however has the disadvantage that it requires three phase networks as well as SAW interdigital structures that cannot be constructed in a single metallization step, needing air gap crossovers, which add substantially to SAW manufacturing costs.

The prior art has attempted to concurrently control both types of reflections to minimize the total reflection ($S_{11}$ in equation 5 of Morgan's *Electronics Letters* referenced above) as, for example, in U.S. Pat. No. 4,353,046. Here, generally, "mechanical-electrical loading" reflections are reduced by split finger structures, while the "regenerated" reflections are reduced by selective loading of the split finger structures with metal during various metallization steps. The problem of frequency limitation due to the split finger structure as well as manufacturing costs associated with the metallization of the split finger structure impact negatively the utility of such a SAW device.

Above referenced teachings indicate that when simultaneously controlling the distortions due to the two types of reflections described above, other parameters, such as, metallized surface area and manufacturing costs, are suboptimal as compared to the present invention.

At this point a distinction is introduced between "generator/receivers", which herein mean that portion of a SAW device that converts electrical energy into an acoustic wave and a "transducer" which means a combination of a "generator/receiver" and a reflector structure used to suppress reflections from the generator/receiver. The transducer structure can convert from electrical to acoustic energy as well as from acoustic to electrical energy.

SUMMARY OF THE INVENTION

It is therefore an objective of the present invention to provide a SAW device having an internal reflector capable of attenuating both "mechanical-electrical loading" related reflections and "regenerated" load related reflections concurrently.

It is another objective of the present invention to provide a SAW device having minimized internal reflections while using a single metallization layer of uniform thickness.

It is another objective of the present invention to provide a SAW device capable of operating at higher frequencies as compared to split finger type SAW implementations.

It is another objective of the present invention to provide a SAW device having low loss characteristics.

It is yet another objective of the present invention to provide a SAW device having minimized reflector area on the piezoelectric substrate.

In general terms, the invention calls for locating a reflector structure between multiple interdigitated acoustic wave generator/receivers located on a piezoelectric substrate forming a ladder type SAW device so as to minimize the reflections from the generator/receivers during normal SAW operation.

Specifically, the reflector structure reduces both:

a) reflections due to the physical presence of generator/receiver fingers (without using a split finger arrangement) as well as;

b) reflections due to the regenerated wave from the generator/receiver.

A dual purpose reflector is used in the proximity of a SAW device generator/receiver. The reflector has a first acoustic phase center. The generator/receiver has a second acoustic phase center, a regenerated coefficient of reflection, $r_e$ and a mechanical-electrical loading coefficient of reflection, $r_m$. The reflector is used for simultaneously reflecting both regenerated and mechanical-electrical loading induced reflections from the generator/receiver, the reflector being sized for a strength of reflection equal to the square root of the sum of the regenerated and mechanical-electrical loading reflections squared. The reflector's phase center is positioned an integral number of acoustic half wavelengths from the phase center of the generator/receiver plus a distance equivalent to either plus or minus half the phase angle given by 90 degrees plus the inverse tangent of the ratio of the "mechanical-electrical loading" reflection $r_m$ to the "regenerated" reflections $r_e$. The sign of the phase angle depends on the mechanical-electrical loading of the piezoelectric substrate by the reflector fingers. The reflector fingers may be electrically shorted together or isolated. The quantities $r_m$ and $r_e$ can be calculated, or practically approximated, from the physical dimensions of the generator/receiver and materials used within the SAW structure.

These together with other objects and advantages of the invention which will be subsequently apparent, reside in the details of construction and operation as more fully hereinafter described and claimed, reference being had to the accompanying drawings forming a part hereof, wherein like numerals refer to like parts throughout.

DETAILED DESCRIPTION OF THE INVENTION

For a better understanding of the present invention, a prior art SAW delay line shown in FIG. 1 will be described first to illustrate the technical concepts of its operation. This will be followed and contrasted by the description of the preferred embodiments of the present invention.

Figure 1:
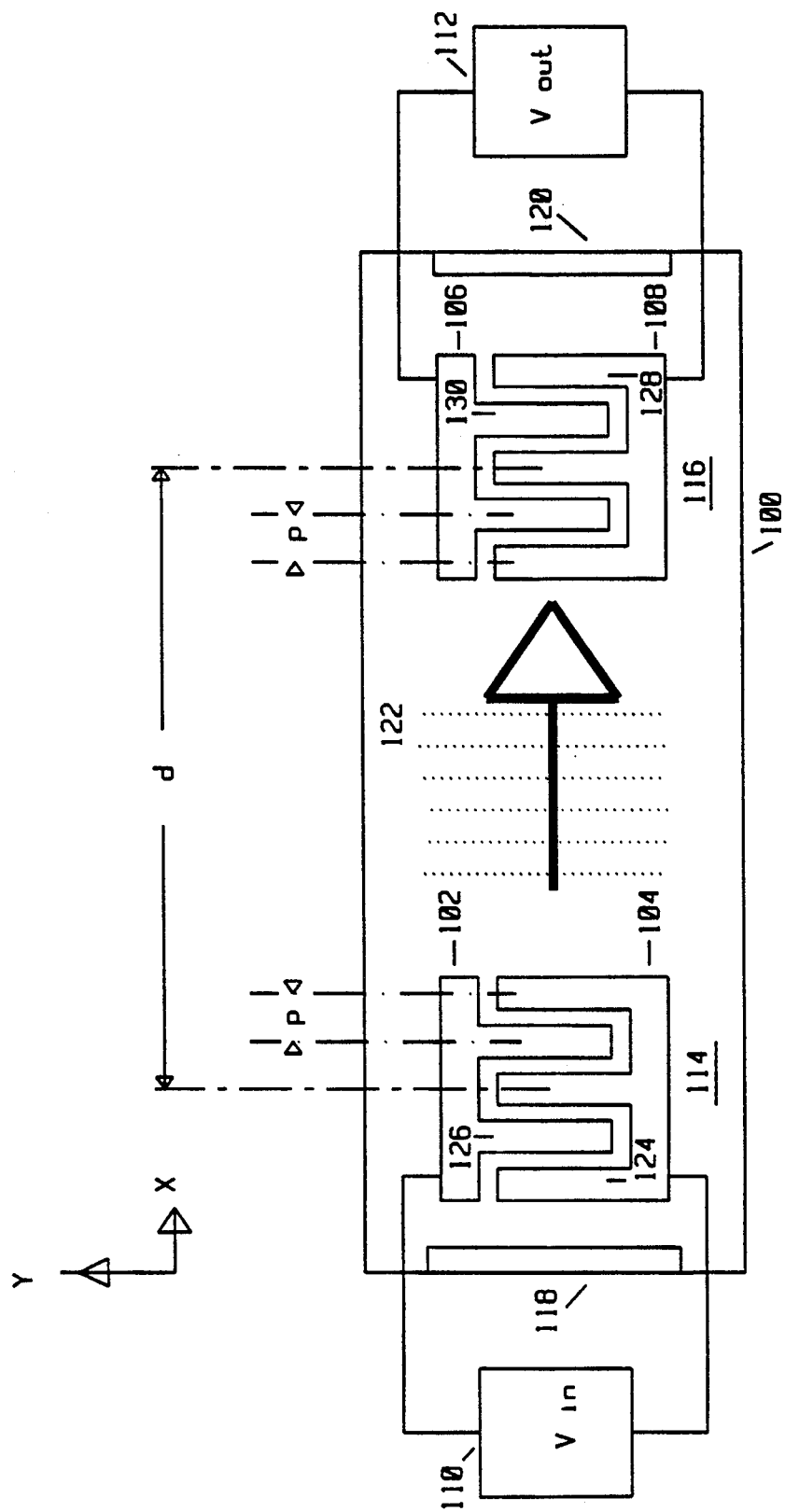
FIG. 1 describes a typical SAW (unapodized) delay line of the prior art having a transmitting and receiving generator/receiver.

FIG. 1 describes a typical SAW (unapodized) delay line of the prior art having a transmitting generator/receiver 114 and a receiving generator/receiver 116 located on piezoelectric substrate 100. On the left of substrate 100, the transmitting generator/receiver 114 has upper finger structure 102 and lower finger structure 104, each having typical metal fingers 126 and 124 respectively, while receiving generator/receiver 116 has upper finger structure 106 and lower finger structure 108. Generator/receiver 114 excites a surface wave 122 on the piezoelectric substrate. Attenuators 118 and 120 are placed opposite the transmitting and receiving generator/receivers respectively, not in the path of surface wave 122, for absorbing undesired waves from the generator/receiver structures.

Both the transmitting generator/receiver 114 and the receiving generator/receiver 116 are of interdigital construction as shown in FIG. 1. Conceptually, the interdigital spacing p shown in FIG. 1 is chosen to accommodate the desired operating frequency, while the distance d between transmitting and receiving generator/receivers provides for the desired time delay between the time of reception of the signal and its convolution at the receiving generator/receiver, as is well known in the art.

In operation, alternating voltage source 110 generating a signal Vin to be delayed and convolved, applies a voltage differential to upper finger structure 102 and lower finger structure 104. This voltage differential induces a surface wave between finger 124 and 126 as well as the other fingers associated with the upper and lower finger structures 102 and 104. This surface wave will now be traveling away from generator/receiver 114 along the X axis on substrate 100. Approximately ½ the energy of the surface wave reaches attenuator 118 where it is absorbed. The other half of the surface wave energy, 122, travels along the surface of substrate 100 to receiving generating/receiver 116 where it is partially converted to an electrical signal Vout by exemplary fingers 128 and 130, and detected in load 112. The perpendicular axes Y and X shown in the left upper corner of FIG. 1 identify two perpendicular directions on the surface of substrate 100.

However, in addition to above stated conceptual operation, other undesirable interactions occur. For example, when the surface wave first encounters the multi finger structure of receiving generator/receiver 116, some of the energy contained therein is not converted but is reflected back towards generator/receiver 114. These reflections are generated because of the "mechanical-electrical loading" presence of generator/receiver 116 and the "regenerated" reflection from generator/receiver 116.

The prior art teaches that providing reflecting fingers offset by $\lambda/4$ from the generator/receiver fingers will reduce "mechanical-electrical loading" reflections from the generator/receiver fingers. The amount of reflection required to reduce the net "mechanical-electrical loading" reflection from these reflecting fingers is designated $r_m$ in FIG. 2.

Furthermore, the prior art also teaches that providing reflecting fingers with reflection centers offset by $\lambda/8$ from the effective centers of the transducing fingers will reduce "regenerated" reflections from the generator/receivers. The sign or direction of the $\lambda/8$ offset for the reflection fingers is determined by the sign of the reflection coefficient for a finger as determined by the finger and substrate properties used for the manufacture of the SAW device. For example, a niobate substrate with isolated fingers has a reflection coefficient that is of opposite sign and of different magnitude as compared to shorted fingers on niobate, or when compared to isolated or shorted fingers on a quartz substrate. The reflection required to reduce the net "regenerated" reflection from these reflecting fingers is designated $r_e$ in FIG. 2.

Unlike the prior art, where separate reflecting structures are considered individually for reducing "mechanical-electrical loading" and "regenerated" refections, the present invention teaches that the combination of the "mechanical-electrical loading" and "regenerated" reflections together can be considered in creating a nearly reflection less SAW device. Specifically, both the amplitude of the "mechanical-electrical loading" reflection, as well as the amplitude of the "regenerated" reflection related to a specific SAW structure are taken into account to arrive at a single reflector structure capable of concurrently reducing both types of reflections.

Figure 2:
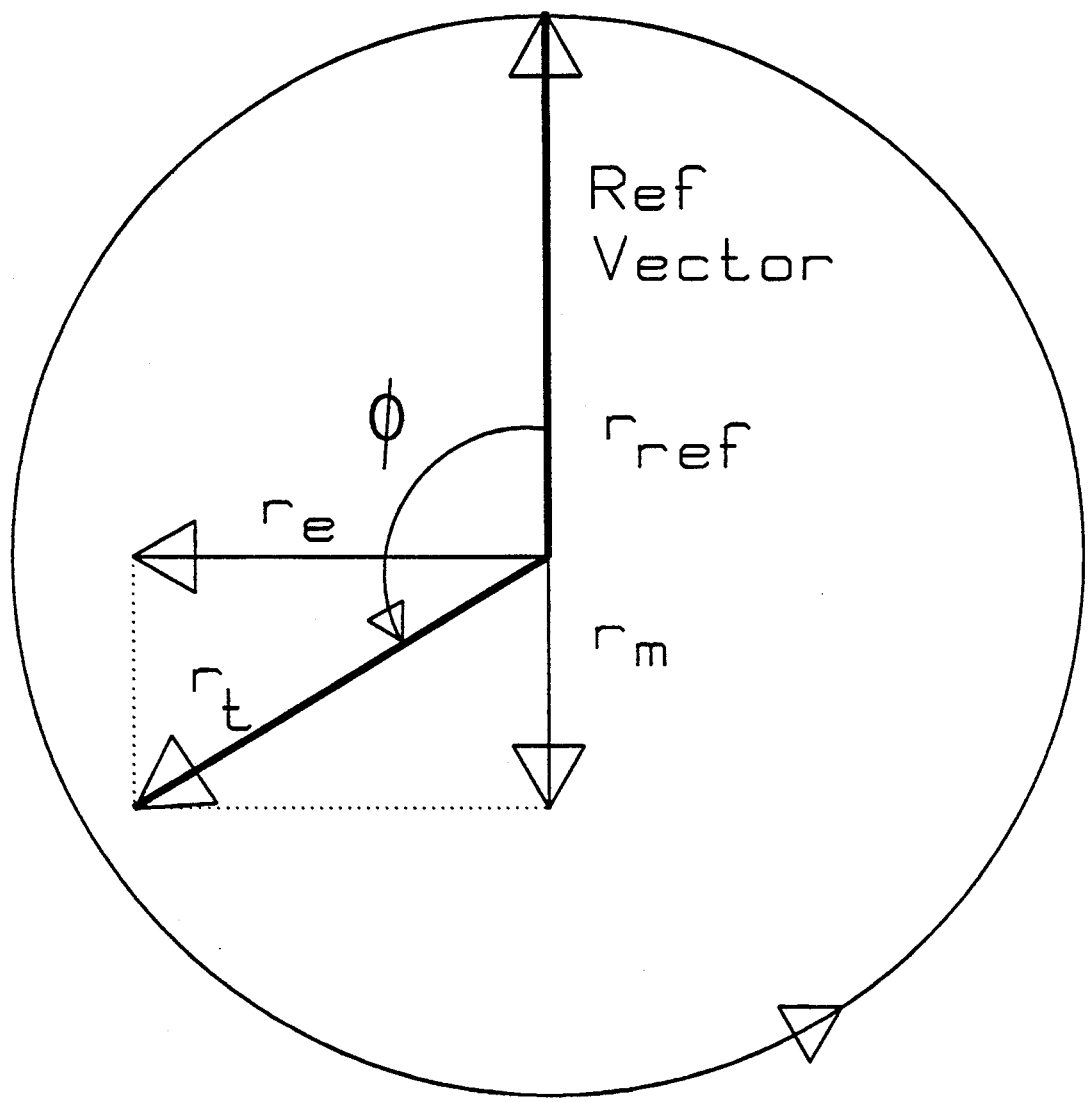
FIG. 2 describes the conceptual relationship between the various reflection related vectors to achieve the preferred embodiment.

FIG. 2 shows the vector relationship described by the present invention for relating the two types of reflections present in a SAW device and the desired reflector output for reducing, or canceling, these reflections. Specifically, the reference vector is coincident with the phase of the mechanical-electrical loading reflection from the unsplit fingers of the generator/receiver segments. Spatially, the reference point for the reference vector, $r_{ref}$ typically corresponds with the geometric center for a symmetric generator/receiver. The counter clockwise direction of rotation of the reference vector shown in FIG. 2 corresponds to the direction of travel of the surface wave from the generator/receiver 116 towards reflector 302 in FIG. 3.

As explained above, $r_e$ is the equivalent voltage vector required for cancellation that is calculated from the well known $\lambda/8$ displacement techniques suggested by the prior art to reduce "regenerated" reflections from generator/receiver 116, while $r_m$ is the equivalent voltage vector needed to cancel the "mechanical-electrical loading" reflections from transducer 116. The referenced "mechanical-electrical loading" reflections are reduced in the prior art by the $\lambda/4$ finger displacement. The invention calls for synthesizing a reflector having a reflection vector $r_t$, at a phase angle $\phi$ from the reference vector, to provide for cancellation of the reflection energy associated with $r_e$ and $r_m$ of the generator/receiver. The phase angle $\phi$ of the reflection vector is referenced to the acoustic surface wave frequency of operation of the device.

Figure 3:
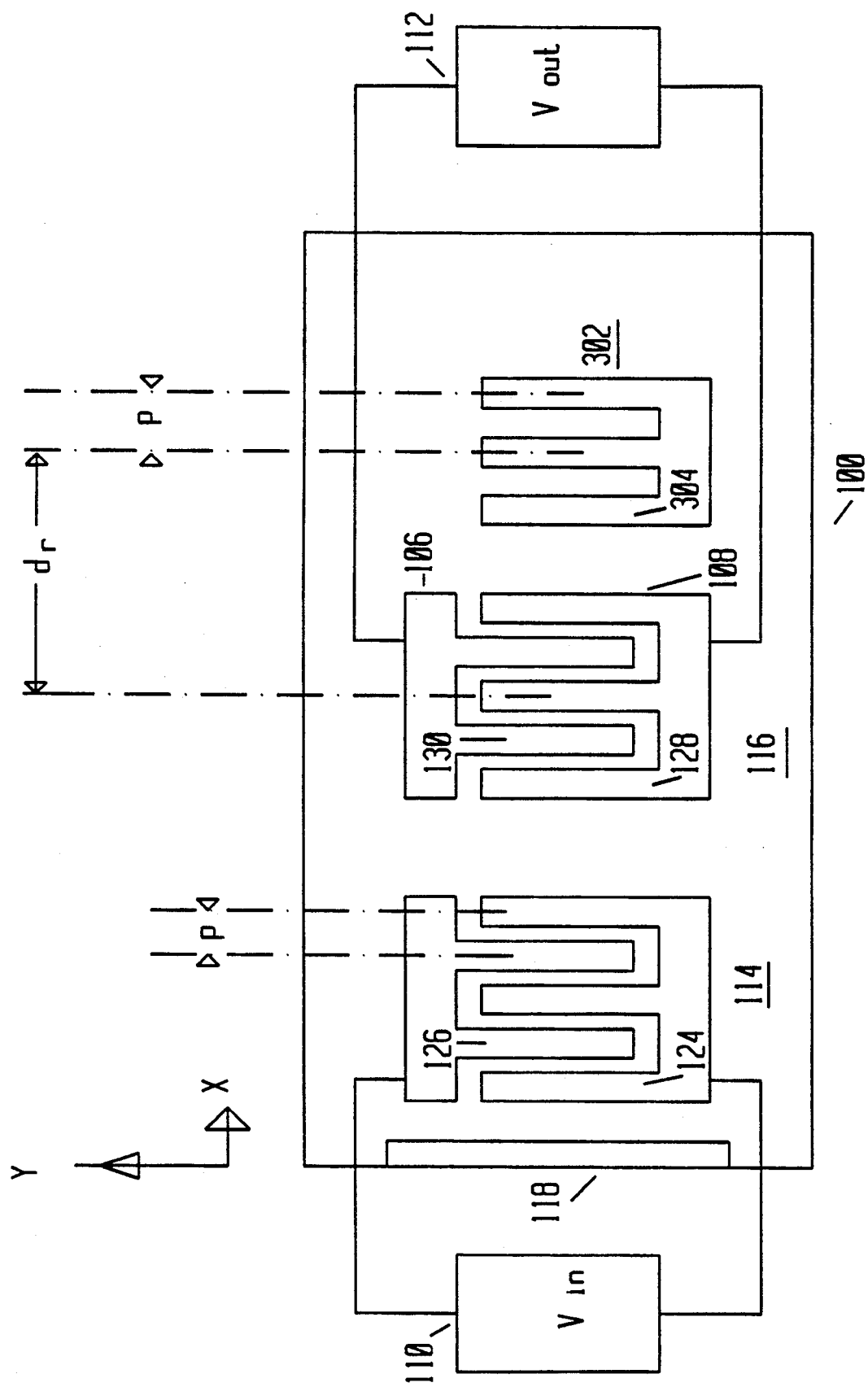
FIG. 3 describes a conceptual SAW device of the present invention using reflector structures to minimize internal undesired reflections.

FIG. 3 shows a structure described by the present invention where both the "mechanical-electrical loading" and "regenerated" reflections are eliminated by the single reflector 302. FIG. 3 shows a partial schematic of a section of a ladder SAW structure, further detailed in FIG. 4. Elements 106, 108, 110, 114, 116, 124, 126, 128, and 130 are the same as those described in FIG. 1. The distance p, input voltage $V_{in}$, and axes X and Y are conceptually the same as in FIG. 1. Output voltage $V_{out}$, now corrected by the presence of reflector 302, is detected in load 112. The repeating element of the ladder structure is the combination of generator/receiver 116 and reflector 302. Reflector 302 has a number of reflecting fingers as shown at 304. The number of these fingers determines the magnitude of the reflection signal, or, equivalently, the length of the $r_t$ vector in FIG. 2, i.e. the desired "strength" of the reflection cancellation signal. The distance $d_r$ for locating the geometric center of reflector 302 from the geometric center of generator/receiver 116 is determined by the phase angle $\phi$ of FIG. 2, referenced to the acoustic surface wave and the geometric center of generator/receiver 116. Elements 100, and 118 are the substrate and reflector as shown in FIG. 1.

Best Mode Implementation

For example, in building a SAW device in accordance with the present invention, 36 degree, rotated Y cut quartz substrate is used, where the acoustic waves propagate in the X direction. The operating frequency of the device is 622 Mhz. The exemplary device has an aluminum metallization thickness for creating the various generator/receivers and reflector fingers of 500 Angstroms. Initially it was determined that a ladder configuration was desired with a fractional bandwidth of 0.54%. In response to this specification, the configuration of the SAW ladder generator/receivers was calculated in accordance with well known methods.

Once the number of generator/receiver fingers is determined, the value of $r_m$ is estimated from methods outlined by H. Robinson, Y. Hahn and J. N. Gau in the *Journal of Applied Physics* Jun. 15, 1989. The value of $r_e$ is estimated from methods outlined by Morgan and others.

Figure 4:
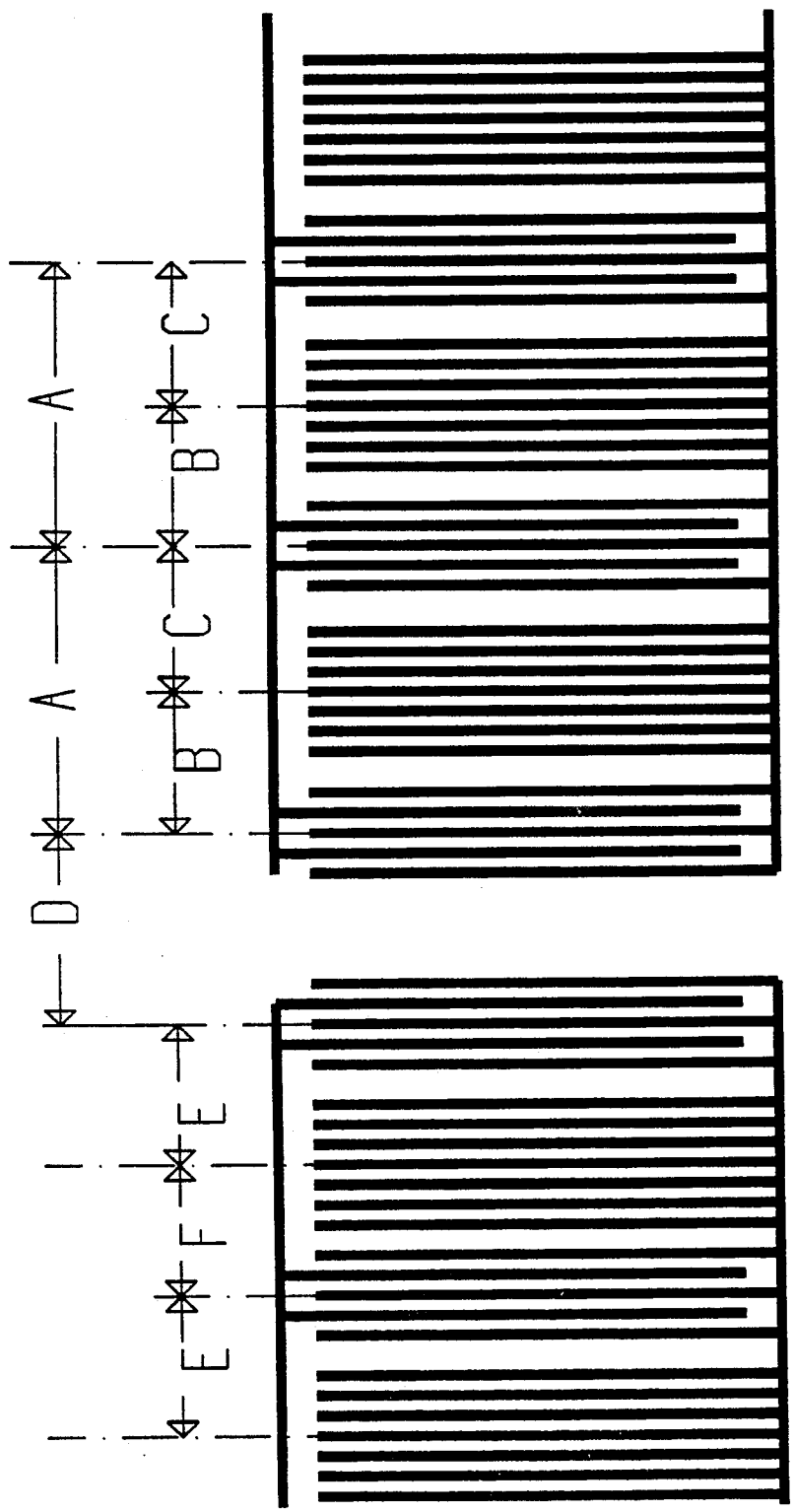
FIG. 4 describes the best mode application of the present invention to a ladder type SAW device where the generator/receiver and reflector structures alternate.

Next, a reflector, schematically identified as 302 in FIG. 3, and represented by segments 403, 407 and 411 in FIG. 4, is constructed so that the reflection amplitude squared of the reflector is equal to the sum of the squares of the computed "mechanical-electrical loading" $r_m$ and "regenerated" $r_e$ reflection components of generator/receiver 116 and its equivalent segments 401, 405, and 409. It is well known in the art to build a SAW acoustic energy reflector having a reflection of a specific amplitude.

As shown in FIG. 4, in a typical SAW device two transducers are used. The building block for a transducer is a generator/receiver plus reflector pair as exemplified by the 401, 403 segment pair. The first exemplary generator/receiver is made up of ladder segments 401, 405, and 409 which are connected to each other to enhance the signal output. The reflection reduction was accomplished by forming reflectors 403, 407, and 409 in the proximity of the generator/receiver segments 401, 405, and 409, as shown. In the alternative, these reflectors could have been left floating or be shorted. In the actual SAW device, six such generator/receiver-reflector pairs are grouped together to form the first reduced reflection transducer. For the chosen operating frequency of 622 Mhz, the spacing A is 31 $\lambda$, B is 16 3/16 $\lambda$, C is 14 13/16 $\lambda$.

The ladder generator/receiver, formed by exemplary segments 413 and 417, can be chosen to be the same as the first generator/receiver, or tailored for another specific transfer function, depending on the convolution desired with the input signal. The associated reflectors 415 and 419 provide reflection cancellation for generator/receivers 413 and 417 respectively. The dimension D between the first and second ladder generator/receivers is not critical as it does not impact the reflection reduction characteristics of this invention. Dimension D is 48 $\lambda$ while dimension E is 9 5/16$\lambda$ and F is 9 11/16 $\lambda$. Other generator/receiver-reflector pairs can be chosen in accordance with this invention by one skilled in the art to accommodate a desired transfer function for the convolution property of the SAW device.

The segments 401, 405, and 409, are each made of 25 fingers, each finger being 1.26 microns wide, and spaced 2.53 microns center to center from the adjacent fingers. Each of reflector segments 403, 407, and 411 are made of 35 fingers of the same width and spacing as the other segments. To summarize, the first reduced reflection transducer is made up of six generator/receiver segments (rungs) of the ladder each having 25 unsplit fingers paired with a corresponding reflector. The mechanical-electrical loading reflections from each generator/receiver segment is therefore 25 times the reflection from a single finger, as is well known in the art. Similarly, the second reflection free transducer is made up of 5 generator/receiver segments, each having 15 fingers, paired to 5 reflector segments, each having 21 fingers, as illustrated by the 413, 415 pairs in FIG. 4.

Specifically, the amplitude squared of the reflection emanating from the reflection suppression structure or reflectors 403, 407 and 411, $r_t^2$, is equal to the sum of the amplitude squared of the mechanical-electrical loading reflection $r_m^2$ plus the amplitude squared of the regenerated reflection $r_e^2$ of segments 401, 405, and 409, as expressed by:

$$r_t^2 = r_e^2 + r_m^2 \quad (1)$$

Keeping in mind that $r_m$ is always negative by definition with respect to the reference vector, the phase $\phi$ of the reflection vector from the reflector with respect to the reference vector is determined (in degrees):

$$\phi = 360n \pm \left(90 + \tan^{-1}\frac{r_m}{r_e}\right) \quad (2)$$

where n is an integer number of acoustic wave cycles at the operating acoustic frequency having a wavelength of $\lambda$ and $\phi$ is the angle between the reference vector and the signal that needs to be synthesized to control the reflections as shown in FIG. 2. The positive or negative sign in equation 2 is determined by the materials used, as previously discussed. For the aluminum on quartz design used herein, the required sign for the parenthetical part in Equation 2 above is minus, i.e. use:

$$\phi = 360n - \left(90 + \tan^{-1}\frac{r_m}{r_e}\right) \quad (2A)$$

The angle $\phi$ is converted to a distance $d_r$ for placing the center of reflection of reflector structure 302 with respect to the center of reflection of generator/receiver 116 in FIG. 3:

$$d_r = \frac{\phi\lambda}{720} \quad (3)$$

The distance $d_r$ is derived from $\phi$ measured in degrees as defined in equation (2A) and $\lambda$ the wavelength at the operating frequency, adjusted by a factor of 720.

In FIG. 4, the distance $d_r$ is equivalent to the quantity B, the spacing between each generator/receiver segment and its associate reflector and is the same for all generator/receiver-reflector pair segments.

As implied by the vector diagram of above relationship shown in FIG. 2, the reference vector is the acoustic reflection emanating from the transmitting generator/receiver segment, while the vector $r_t$ is the resultant vector to be generated by the reflection suppression configuration. The specified phase angle $\phi$ is implemented by choosing the distance $d_r$ of the reflector phase center from the generator/receiver's phase center.

By using the method and apparatus of this invention, the area of the SAW device is minimized because only one reflector needs to be used to reduce both "regenerated" and "mechanical-electrical loading" reflections, as compared with the need of the prior art to have two different reflectors for the two different types of reflection. In the alternative, less reflector area is needed between generator/receivers so more area is available to add generator/receiver fingers, thereby improving the performance of the generator/receivers and rendering the SAW device more efficient, especially on weak piezoelectric materials such as quartz.

Furthermore, by using the method and apparatus of this invention a low loss SAW device is realized. The low loss comes from the reflector's ability to reflect a large portion of the energy generally lost in one direction from the generator/receiver.

An iterative procedure can be used to arrive at the optimal balance between the amplitude values of the generator/receivers, reflection control desired, and overall performance while using above constraints.

Figure 5:
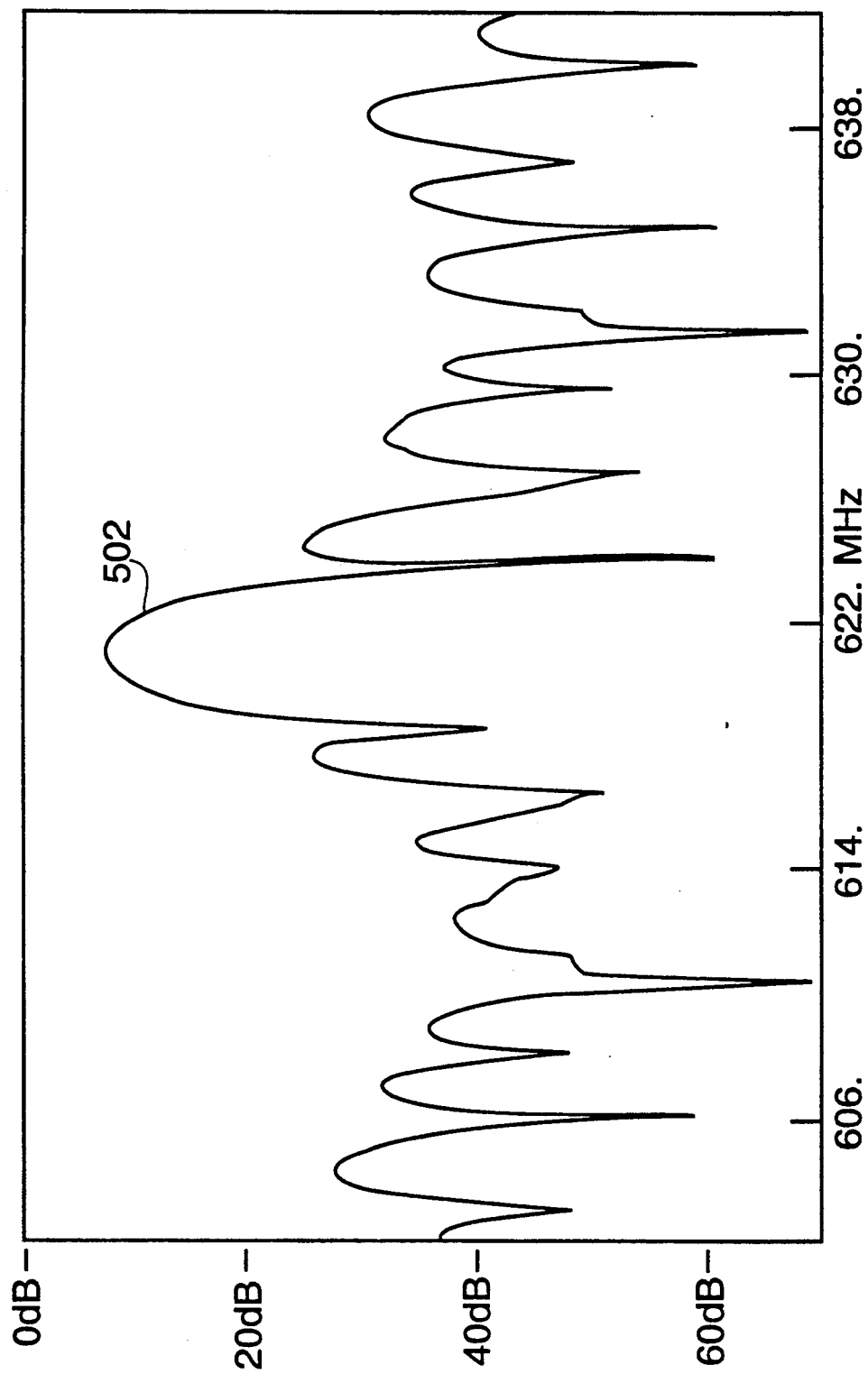
FIG. 5 describes the frequency response of an exemplary SAW device built in accordance with the present invention.
Figure 6:
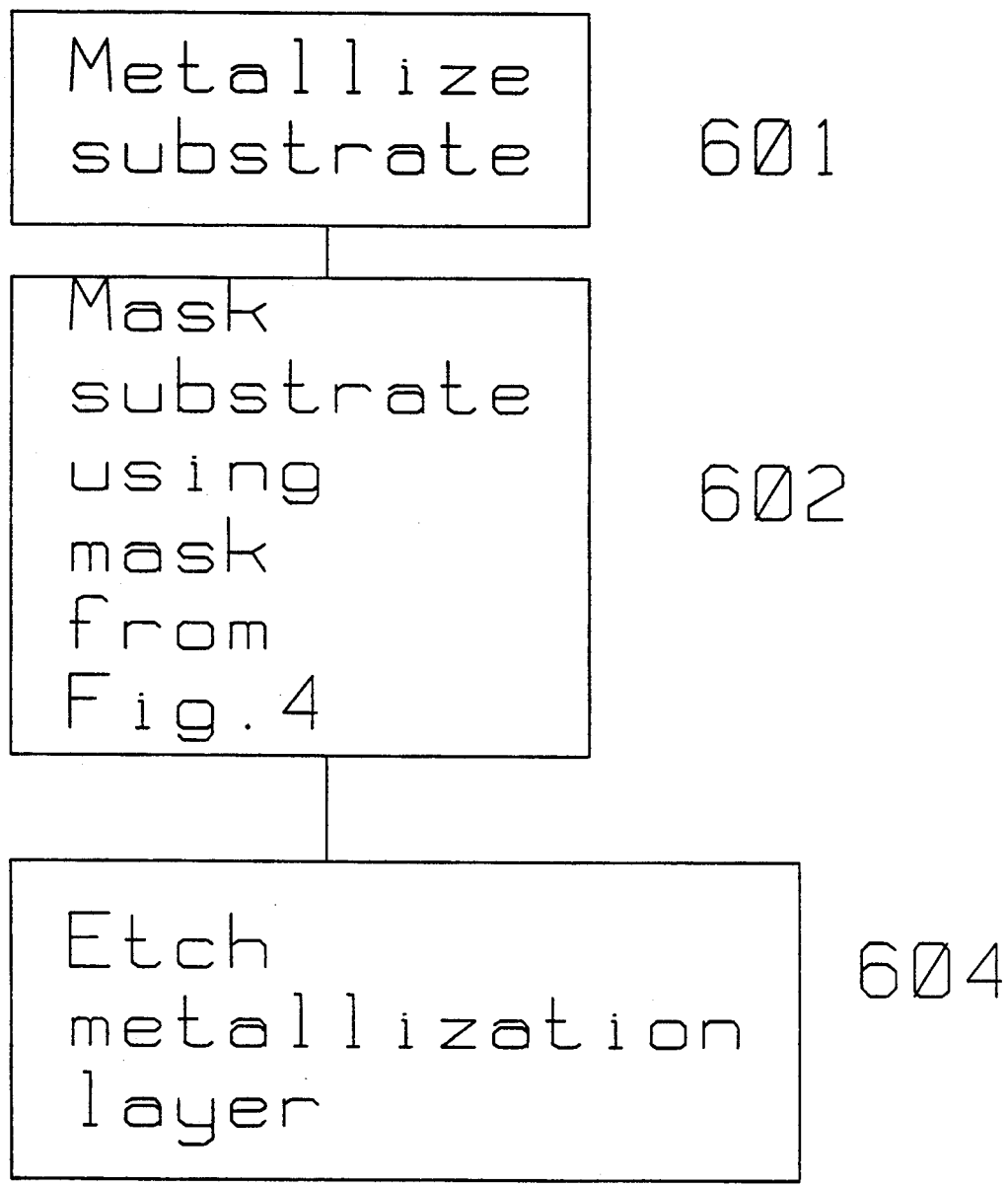
FIG. 6 describes steps generally associated with the manufacture of an exemplary embodiment of the present invention.

A device created by above method including the steps forming the SAW generator/receiver, forming the reflector and locating the reflector phase center the prescribed distance $d_r$ from the generator/receiver phase center are generally performed concurrently and simultaneously, typically at the time of creating a lithographic mask for etching a metallization layer for making the SAW device. The performance of such a device, built in accordance with the present invention and having the mechanical characteristics described with regard to FIG. 4 is shown in FIG. 5, where the peak of the first sidelobe is about −20 db below the maximum value. In FIG. 5, the amplitude of the device response is represented by curve 502. The vertical axis denotes decibels of amplitude, while the horizontal axis shows SAW operating frequency in Megacycles. FIG. 6 shows the method for making of the SAW device, where 602 shows the masking step and 604 shows the etching step for creating a ladder structure essentially as described in FIG. 4. Step 601 shows the metallization step generally associated with the application of a conductive metal layer to a piezoelectric substrate for subsequent masking and etching to create the metal fingers.

All patents and publications listed herein above are hereby incorporated by reference in their entirety.

Although the present invention has been shown and described with respect to preferred embodiments, various changes and other modifications which are obvious to persons skilled in the art to which the invention pertains are deemed to lie within the spirit and scope of the invention. For example, the above-described embodiments utilize a specific piezoelectric material as well as a specific metallization metal. However, the invention can also be used with other piezoelectric materials as well as different metallization metals for the generator/receiver and reflector sections to achieve the same results. Furthermore, instead of a having a shorted reflector finger structure, the reflector fingers can be floating to obtain a similar reflection canceling effect by applying the teachings of this invention.

I claim:

1. A method for making a SAW transducer and reflector combination comprising the steps of:
    forming a SAW transducer on a substrate for supporting acoustic waves, said transducer characterized by a mechanical-electrical loading reflection, a regenerated reflection and a first phase center;
    forming a SAW reflector on said substrate for supporting acoustic waves characterized by a reflection amplitude equal to the square root of the sum of said mechanical-electrical loading reflection squared plus said regenerated reflections squared, and having a second phase center;
    locating said SAW reflector so that said second phase center is separated from said first center by an equivalent distance equal to half the sum of an integral number of acoustic wavelengths minus the addition of 90 degrees plus the tangent inverse of the ratio of said mechanical-electrical loading reflections to said regenerated reflections times a wavelength dependent proportionality factor.

2. A SAW device created by the method of claim 1 wherein the steps of forming said SAW transducer, forming said SAW reflector, and locating said SAW reflector are performed simultaneously during manufacture of said SAW device.

3. A device created by the method of claim 1 wherein the steps forming said SAW transducer, forming said reflector, and locating said reflector are performed at the time of etching a metallization layer on said substrate.

4. A system comprising at least one first transducer and at least one reflector in the proximity of at least one second transducer, disposed on a substrate for supporting acoustic waves wherein each of said second transducer is characterized by a first acoustic phase center, a first regenerated reflection, and a first mechanical-electrical loading reflection, and each of said reflector is characterized by a second acoustic phase center and has a strength of reflection equal to the square root of the sum of said first regenerated reflection squared plus said first mechanical-electrical loading reflection squared and said second phase center is positioned an equivalent distance equal to half the sum of an integral number of acoustic wavelengths from said first phase center minus the addition of 90 degrees plus a phase angle equal to the tangent inverse of the ratio of said first mechanical-electrical reflection to said first regenerated reflection times a wavelength dependent proportionality factor.

5. A system comprising at least one first transducer and at least one reflector in the proximity of at least one second transducer, disposed on a substrate for supporting acoustic waves wherein each of said second transducer is characterized by a first acoustic phase center, a first regenerated reflection, and a first mechanical-electrical loading reflection, and each of said reflector is characterized by a second acoustic phase center and has a strength of reflection equal to the square root of the sum of said first regenerated reflection squared plus said first mechanical-electrical loading reflection squared and said second phase center is positioned an equivalent distance equal to half the sum of an integral number of acoustic wavelengths from said first phase center plus the addition of 90 degrees plus a phase angle equal to the tangent inverse of the ratio of said first mechanical-electrical reflection to said first regenerated reflection times a wavelength dependent proportionality factor.

6. A method for making a SAW transducer and reflector combination comprising the steps of:
    forming a SAW transducer on a substrate for supporting acoustic waves, said transducer characterized by a mechanical-electrical loading reflection, a regenerated reflection and a first phase center;
    forming a SAW reflector on said substrate for supporting acoustic waves characterized by a reflection amplitude equal to the square root, of the sum of said mechanical-electrical loading reflection squared plus said regenerated reflections squared, and having a second phase center;
    locating said SAW reflector so that said second phase center is separated from said first center by an equivalent distance equal to half the sum of an integral number of acoustic wavelengths plus the addition of 90 degrees plus the tangent inverse of the ratio of said mechanical-electrical loading reflections to said regenerated reflections times a wavelength dependent proportionality factor.

7. A SAW device created by the method of claim 6 wherein the steps of forming said SAW transducer, forming said SAW reflector, and locating said SAW reflector are performed simultaneously during manufacture of said SAW device.

8. A device created by the method of claim 6 wherein the steps forming said SAW transducer, forming said reflector, and locating said reflector are performed at the time of disposing a conductive layer on said substrate.

9. A SAW transducer comprising:
   a substrate for supporting acoustic waves;
   a plurality of metal fingers disposed on said substrate characterized by a first acoustic phase center, a regenerated reflection and a mechanical-electrical loading reflection;
   a reflector of acoustic waves, also disposed on said substrate, characterized by a second acoustic phase center and a reflection amplitude equal to the square root of the sum of said regenerated reflection squared plus said mechanical-electrical loading reflection squared;
   said first acoustic phase center and said second acoustic phase center spaced by a distance equivalent to half the sum of an integral number of acoustic wavelengths plus the addition of 90 degrees and a phase angle equal to the tangent inverse of the ratio of said mechanical-electrical reflection to said regenerated reflection times a wavelength dependent proportionality factor.

10. A SAW transducer comprising:
    a substrate for supporting acoustic waves;
    a plurality of metal fingers disposed on said substrate characterized by a first acoustic phase center, a regenerated reflection and a mechanical-electrical loading reflection;
    a reflector of acoustic waves, also disposed on said substrate, characterized by a second acoustic phase center and a reflection amplitude equal to the square root of the sum of said regenerated reflection squared plus said mechanical-electrical loading reflection squared;
    said first acoustic phase center and said second acoustic phase center spaced by a distance equivalent to half the sum of an integral number of acoustic wavelengths minus the addition of 90 degrees and a phase angle equal to the tangent inverse of the ratio of said mechanical-electrical reflection to said regenerated reflection times a wavelength dependent proportionality factor.

11. A SAW device comprising:
    a substrate for supporting acoustic waves;
    a first plurality of metal fingers disposed on said substrate characterized by a first acoustic phase center, a regenerated reflection and a mechanical-electrical loading reflection;
    a reflector of acoustic waves disposed on said substrate, characterized by a second acoustic phase center and a reflection amplitude equal to the square root of the sum of said regenerated reflection squared plus said mechanical-electrical loading reflection squared;
    said first acoustic phase center and said second acoustic phase center spaced by a distance equivalent to half the sum of an integral number of acoustic wavelengths plus the addition of 90 degrees and a phase angle equal to the tangent inverse of the ratio of said mechanical-electrical reflection to said regenerated reflection times a wavelength dependent proportionality factor.

12. A SAW device comprising:
    a substrate for supporting acoustic waves;
    a first plurality of metal fingers disposed on said substrate characterized by a first acoustic phase center, a regenerated reflection and a mechanical-electrical loading reflection;
    a reflector of acoustic waves disposed on said substrate, characterized by a second acoustic phase center and a reflection amplitude equal to the square root of the sum of said regenerated reflection squared plus said mechanical-electrical loading reflection squared;
    said first acoustic phase center and said second acoustic phase center spaced by a distance equivalent to half the sum of an integral number of acoustic wavelengths minus the addition of 90 degrees and a phase angle equal to the tangent inverse of the ratio of said mechanical-electrical reflection to said regenerated reflection times a wavelength dependent proportionality factor.

13. A dual purpose reflector associated with an acoustic wave transducer, said reflector and said transducer disposed on a substrate for supporting acoustic waves;
    said reflector characterized by a first acoustic phase center, and said transducer characterized by a second acoustic phase center, a regenerated reflection, and a mechanical-electrical loading reflection, said reflector simultaneously reducing both regenerated and mechanical-electrical loading induced reflection from said transducer, wherein said reflector has a strength of reflection equal to the square root of the sum of said regenerated reflection squared plus said mechanical-electrical loading reflection squared and said first phase center is positioned an equivalent distance equal to half the sum of an integral number of acoustic wavelengths plus the addition of 90 degrees and a phase angle equal to the tangent inverse of the ratio of said mechanical-electrical reflection to said regenerated reflection times a wavelength dependent proportionality factor.

14. A dual purpose reflector associated with an acoustic wave transducer, said reflector and said transducer disposed on a substrate for supporting acoustic waves;
    said reflector characterized by a first acoustic phase center, and said transducer characterized by a second acoustic phase center, a regenerated reflection, and a mechanical-electrical loading reflection, said reflector simultaneously reducing both regenerated and mechanical-electrical loading induced reflection from said transducer, wherein said reflector has a strength of reflection equal to the square root of the sum of said regenerated reflection squared plus said mechanical-electrical loading reflection squared and said first phase center is positioned an equivalent distance equal to half the sum of an integral number of acoustic wavelengths minus the addition of 90 degrees and a phase angle equal to the tangent inverse of the ratio of said mechanical-electrical reflection to said regenerated reflection times a wavelength dependent proportionality factor.

15. A SAW device having a plurality of transducers and a plurality of dual purpose reflectors on a substrate for supporting acoustic waves, each of said transducers in the proximity of a corresponding dual purpose reflector, said reflector characterized by a first acoustic phase center, each of said plurality of transducers characterized by a second acoustic phase center, a regenerated reflection, and a mechanical-electrical loading reflection, wherein each said reflector has a strength of reflection equal to the square root of the sum of said regenerated reflection squared plus said mechanical-electrical loading reflection squared and said first phase center is positioned an equivalent distance equal to half the sum of an integral number of acoustic wavelengths from said second phase center plus the addition of 90 degrees plus a phase angle equal to the tangent inverse of the ratio of said mechanical-electrical reflection to said regenerated reflection times a wavelength dependent proportionality factor.

16. A SAW device having a plurality of transducers and a plurality of dual purpose reflectors on a substrate for supporting acoustic waves, each of said transducers in the proximity of a corresponding dual purpose reflector, said reflector characterized by a first acoustic phase center, each of said plurality of transducers characterized by a second acoustic phase center, a regenerated reflection, and a mechanical-electrical loading reflection, wherein each said reflector has a strength of reflection equal to the square root of the sum of said regenerated reflection squared plus said mechanical-electrical loading reflection squared and said first phase center is positioned an equivalent distance equal to half the sum of an integral number of acoustic wavelengths from said second phase center minus the addition of 90 degrees plus a phase angle equal to the tangent inverse of the ratio of said mechanical-electrical reflection to said regenerated reflection times a wavelength dependent proportionality factor.

17. A system comprising at least one SAW input section comprising at least one first reflector in the proximity of at least one first transducer and a SAW output section comprising at least one second reflector in the proximity of at least one second transducer, said input section and said output section disposed on a substrate for supporting acoustic waves, wherein each of said first transducer is characterized by a first acoustic phase center, a first regenerated reflection, and a first mechanical-electrical loading reflection, and each of said first reflector is characterized by a second acoustic phase center and a strength of reflection equal to the square root of the sum of said first regenerated reflection squared plus said first mechanical-electrical loading reflection squared and said first phase center is positioned an equivalent distance equal to half the sum of an integral number of acoustic wavelengths from said second phase center plus the addition of 90 degrees plus a phase angle equal to the tangent inverse of the ratio of said first mechanical-electrical reflection to said first regenerated reflection times a wavelength dependent proportionality factor and wherein each of said second transducer is characterized by a third acoustic phase center, a second regenerated reflection, and a second mechanical-electrical loading reflection, and each of said second reflector is characterized by a fourth acoustic phase center and has a strength of reflection equal to the square root of the sum of said second regenerated reflection squared plus said second mechanical-electrical loading reflection squared and said third phase center is positioned an equivalent distance equal to half the sum of an integral number of acoustic wavelengths from said fourth phase center plus the addition of 90 degrees plus a phase angle equal to the tangent inverse of the ratio of said second mechanical-electrical reflection to said second regenerated reflection times a wavelength dependent proportionality factor.

18. A system comprising at least one SAW input section comprising at least one first reflector in the proximity of at least one first transducer and a SAW output section comprising at least one second reflector in the proximity of at least one second transducer, said input section and said output section disposed on a substrate for supporting acoustic waves, wherein each of said first transducer is characterized by a first acoustic phase center, a first regenerated reflection, and a first mechanical-electrical loading reflection, and each of said first reflector is characterized by a second acoustic phase center and a strength of reflection equal to the square root of the sum of said first regenerated reflection squared plus said first mechanical-electrical loading reflection squared and said first phase center is positioned an equivalent distance equal to half the sum of an integral number of acoustic wavelengths from said second phase center minus the addition of 90 degrees plus a phase angle equal to the tangent inverse of the ratio of said first mechanical-electrical reflection to said first regenerated reflection times a wavelength dependent proportionality factor and wherein each of said second transducer is characterized by a third acoustic phase center, a second regenerated reflection, and a second mechanical-electrical loading reflection, and each of said second reflector is characterized by a fourth acoustic phase center and has a strength of reflection equal to the square root of the sum of said second regenerated reflection squared plus said second mechanical-electrical loading reflection squared and said third phase center is positioned an equivalent distance equal to half the sum of an integral number of acoustic wavelengths from said fourth phase center plus the addition of 90 degrees plus a phase angle equal to the tangent inverse of the ratio of said second mechanical-electrical reflection to said second regenerated reflection times a wavelength dependent proportionality factor.

19. A system comprising at least one SAW input section comprising at least one first reflector in the proximity of at least one first transducer and a SAW output section comprising at least one second reflector in the proximity of at least one second transducer, said input section and said output section disposed on a substrate for supporting acoustic waves, wherein each of said first transducer is characterized by a first acoustic phase center, a first regenerated reflection, and a first mechanical-electrical loading reflection, and each of said first reflector is characterized by a second acoustic phase center and a strength of reflection equal to the square root of the sum of said first regenerated reflection squared plus said first mechanical-electrical loading reflection squared and said first phase center is positioned an equivalent distance equal to half the sum of an integral number of acoustic wavelengths from said second phase center plus the addition of 90 degrees plus a phase angle equal to the tangent inverse of the ratio of said first mechanical-electrical reflection to said first regenerated reflection times a wavelength dependent proportionality factor and wherein each of said second transducer is characterized by a third acoustic phase center, a second regenerated reflection, and a second mechanical-electrical loading reflection, and each of said second reflector is characterized by a fourth acoustic phase center and has a strength of reflection equal to the square root of the sum of said second regenerated reflection squared plus said second mechanical-electrical loading reflection squared and said third phase center is positioned an equivalent distance equal to half the sum of an integral number of acoustic wavelengths from said fourth phase center minus the addition of 90 degrees plus a phase angle equal to the tangent inverse of the ratio of said second mechanical-electrical reflection to said second regenerated reflection times a wavelength dependent proportionality factor.

20. A system comprising at least one SAW input section comprising at least one first reflector in the proximity of at least one first transducer and a SAW output section comprising at least one second reflector in the proximity of at least one second transducer, said input section and said output section disposed on a substrate for supporting acoustic waves, wherein each of said first transducer is characterized by a first acoustic phase center, a first regenerated reflection, and a first mechanical-electrical loading reflection, and each of said first reflector is characterized by a second acoustic phase center and a strength of reflection equal to the square root of the sum of said first regenerated reflection squared plus said first mechanical-electrical loading reflection squared and said first phase center is positioned an equivalent distance equal to half the sum of an integral number of acoustic wavelengths from said second phase center minus the addition of 90 degrees plus a phase angle equal to the tangent inverse of the ratio of said first mechanical-electrical reflection to said first regenerated reflection times a wavelength dependent proportionality factor and wherein each of said second transducer is characterized by a third acoustic phase center, a second regenerated reflection, and a second mechanical-electrical loading reflection, and each of said second reflector is characterized by a fourth acoustic phase center and has a strength of reflection equal to the square root of the sum of said second regenerated reflection squared plus said second mechanical-electrical loading reflection squared and said third phase center is positioned an equivalent distance equal to half the sum of an integral number of acoustic wavelengths from said fourth phase center minus the addition of 90 degrees plus a phase angle equal to the tangent inverse of the ratio of said second mechanical-electrical reflection to said second regenerated reflection times a wavelength dependent proportionality factor.

* * * * *